United States Patent
Tweet et al.

(10) Patent No.: US 6,699,764 B1
(45) Date of Patent: *Mar. 2, 2004

(54) METHOD FOR AMORPHIZATION RE-CRYSTALLIZATION OF $SI_{1-X}GE_X$ FILMS ON SILICON SUBSTRATES

(75) Inventors: Douglas J. Tweet, Camas, WA (US); Jer-shen Maa, Vancouver, WA (US); Jong-Jan Lee, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/238,146

(22) Filed: Sep. 9, 2002

(51) Int. Cl.[7] .............................. H01L 21/336
(52) U.S. Cl. ...................... 438/305; 438/482; 438/520; 438/602; 438/933
(58) Field of Search ................. 438/305, 667, 438/602, 482–483, 933, 501–522; 257/19, 52, 55, 190

(56) References Cited

U.S. PATENT DOCUMENTS 6,455,871 B1 * 9/2002 Shim et al. ................. 257/12
6,464,780 B1 10/2002 Mantl et al. ................ 117/90

OTHER PUBLICATIONS

S. Mantl et al., *Strain relaxation of epitaxial SiGe layer on silicon (100) improved by hydrogen implantation*, Nuclear Instruments and Methods in Physics Research B vol. 147, 29 (1999).

A.N. Larsen et al., *MeV ion implantation induced damage in relaxed in $Si_{1-x}Ge_x$*, J. Appl. Phys., vol. 81, 2208 (1997).

T.E. Haynes, et al., *Damage accumulation during ion implantation of unstrained $Si_{1-x}Ge_x$ alloy layers*, Appl. Phys. Lett., vol. 61, 61 (1992).

D.Y.C. Lie, et al., *Damage and strain in epitaxial $Ge_xSi_{1-x}$ films irradiated with Si*, J. Appl. Phys. vol. 74, 6039 (1993).

D.C. Paine, et al., *The growth of strained $Si_{1-x}Ge_x$ alloys on (001) silicon using solid phase epitaxy*, J. Mater. Res., vol. 5, 1023 (1990).

C. Lee, et al., *Kinetics of solid phase eptiaxial regrowth in amorphized $Si_{0.88}Ge_{0.12}$ measured by time–resolved reflectivity*, Appl. Phys. Lett., vol. 62, 501 (1993).

Q.Z. Hong, et al., *Solid phase epitaxy of stressed and stress–relaxed Ge–Si alloys*, J. Appl. Phys. vol. 71, 1768 (1992).

* cited by examiner

*Primary Examiner*—Thanh Nguyen
(74) *Attorney, Agent, or Firm*—David C. Ripma; Matthew D. Rabdau; Scott C. Krieger

(57) ABSTRACT

A method of fabricating a $Si_{1-X}Ge_X$ film on a silicon substrate includes preparing a silicon substrate; epitaxially depositing a $Si_{1-X}Ge_X$ layer on the silicon substrate forming a $Si_{1-X}Ge_X$/Si interface there between; epitaxially growing a silicon cap on the $Si_{1-X}Ge_X$ layer; implanting hydrogen ions through the $Si_{1-X}Ge_X$ layer to a depth of between about 3 nm to 100 nm below the $Si_{1-X}Ge_X$/Si interface; amorphizing the $Si_{1-X}Ge_X$ layer to form an amorphous, graded SiGe layer; and annealing the structure at a temperature of between about 650° C. to 1100° C. for between about ten seconds and sixty minutes to recrystallize the SiGe layer.

18 Claims, 2 Drawing Sheets

METHOD FOR AMORPHIZATION RE-CRYSTALLIZATION OF $SI_{1-x}GE_x$ FILMS ON SILICON SUBSTRATES

RELATED APPLICATIONS

This Application is related to (1) Method to form relaxed SiGe layer with high Ge content, Ser. No. 10/062,319, filed Jan. 31, 2002; (2) Method to form thick relaxed SiGe layer with trench structure, Ser. No. 10/062,336, filed Jan. 31, 2002; (3) Amorphization Re-cystallization of $Si_{1-x}Ge_x$ on Silicon film, Ser. No. 10/098,757, filed Mar. 13, 2002; (4) Method to form relaxed SiGe layer with high Ge content using implantation of molecular hydrogen, Ser. No. 10/099,374, filed Mar. 13, 2002 now U.S. Pat. No. 6,562,703

FIELD OF THE INVENTION

This invention relates to devices for high speed CMOS integrated circuits, and specifically to commercial production of VLSI ICs having $Si_{1-x}Ge_x$ layers by providing a layer of tensile strained silicon on a relaxed $Si_{1-x}Ge_x$ layer to speed switching speeds for nMOS and pMOS transistors.

BACKGROUND OF THE INVENTION

There are many publications describing a thick layer of $Si_{1-x}Ge_x$ with graded Ge composition (x) followed by a thick, relaxed $Si_{1-x}Ge_x$ layer of constant x capped by a thin silicon film under tensile strain, which is used for fabricating high drain drive current MOS transistors. Due to the lattice parameter mismatch between the $Si_{1-x}Ge_x$ layers and the silicon substrate, there is a high density of misfit dislocations at the SiGe/Si substrate interface, accompanied by numerous threading dislocations in the SiGe, some of which propagate all the way to the surface. The total SiGe thickness is on the order of several microns and the density of threading dislocations at the surface is still on the order of $1 \times 10^5$ cm$^{-2}$. However, the very thick $Si_{1-x}Ge_x$ layer and the high defect density of the conventional $Si_{1-x}Ge_x$ process is not applicable for large-scale integrated circuit fabrication.

As demonstrated in S. Mantl et al., *Strain relaxation of epitaxial SiGe layer on silicon (100) improved by hydrogen implantation*, Nuclear Instruments and Methods in Physics Research B vol. 147, 29 (1999), and expanded upon in the above-identified related Applications 1 and 2, strain relaxed high quality $Si_{1-x}Ge_x$ layers on silicon can be obtained by hydrogen ion implantation and annealing. Hydrogen ion implantation forms a narrow defect band slightly below the SiGe/Si interface. During subsequent annealing hydrogen platelets and cavities form, nucleating misfit dislocations, and giving rise to strong enhanced strain relaxation in the $Si_{1-x}Ge_x$ epilayer. Hydrogen ions may also terminate some threading dislocations, preventing them from propagating toward the $Si_{1-x}Ge_x$ surface. The related Applications 1 and 2 provide methods to reduce defect density and fabricate high drive current MOS transistors on a relaxed $Si_{1-x}Ge_x$ film having thickness on the order of about only 300 nm. However, the defect density of the $Si_{1-x}Ge_x$ film by these processes is still not suitable to very large-scale integrated circuit fabrication.

Related Application 3 discloses a method to further reduce the defect density in $Si_{1-x}Ge_x$ films. In this related method, a buried amorphous region in the film is fabricated, e.g., with $Si^+$ ion implantation, and then recrystallized through solid phase epitaxy (SPE) using as the seed the undamaged crystalline $Si_{1-x}Ge_x$ region at the surface. However, the process window for making a buried amorphous region in SiGe may be rather narrow, because it has been consistently reported that SiGe is much more easily damaged by $Si^+$ ion implantation than silicon, A. N. Larsen et al., *MeV ion implantation induced damage in relaxed $Si_{1-x}Ge_x$*, J. Appl. Phys., vol. 81, 2208 (1997); T. E. Haynes, et al., *Damage accumulation during ion implantation of unstrained $Si_{1-x}Ge_x$ alloy layers*, Appl. Phys. Lett., vol. 61, 61 (1992); and D. Y. C. Lie, et al., *Damage and strain in epitaxial $Ge_xSi_{1-x}$ films irradiated with Si*, J. Appl. Phys. Vol. 74, 6039 (1993). The critical dose for amorphization, ($\phi_c$), decreases with increasing Ge concentration. This holds true for both strained and relaxed SiGe. For 2 MeV $Si^+$ ions implanted at 27° C., $\phi_c$=6.7e14 cm$^{-2}$ for 20% Ge but only 4.6e14 cm$^{-2}$ for 30% Ge, per Larsen et al. For 100 keV $Si^+$ ions implanted at room temperature, it has been reported that $\phi_c$=7e14 cm$^{-2}$ and 2.5e14 cm$^{-2}$ for pure silicon and 10% Ge, respectively, Lie et al. For 80–90 keV $Si^+$ ions implanted at 77K, it has been reported that $\phi_c$=1.5, 1.0, 0.8, and 0.5 e14 cm$^{-2}$ for 0%, 15%, 50%, and 100% Ge, respectively, Haynes et al. This effect is thought to be due to both an increase in the average energy density per ion deposited in the collision cascade and a stabilization of the damage through a reduction of defect mobility, Haynes et al. and Lie et al. There is also a strong dependence on the wafer temperature during implant, $T_1$, with the damage decreasing at higher $_{T1}$, so $\phi_c$ will depend on temperature, Haynes et al.

A substrate having a $Si_{1-x}Ge_x$ layer with graded composition is often used for growing tensile-strained silicon films, wherein the highest Ge concentration is located at the surface, as described in related Application 1. In this case, it may be even more difficult to avoid damaging or amorphizing the surface layer, because the higher Ge content makes the surface more susceptible to damage. If so, there will be no crystalline seed at the surface to nucleate SPE, and SPE will proceed only from the bottom, usually resulting in a heavily defected film. The instant invention is a method for preserving the crystallinity of the surface layer, in order to use it as a seed for SPE of the underlying amorphized $Si_{1-x}Ge_x$ film.

SUMMARY OF THE INVENTION

A method of fabricating a $Si_{1-X}Ge_X$ film on a silicon substrate includes preparing a silicon substrate; epitaxially depositing a $Si_{1-X}Ge_X$ layer on the silicon substrate forming a $Si_{1-X}Ge_X$/Si interface there between; epitaxially growing a silicon cap on the $Si_{1-X}Ge_X$ layer; implanting hydrogen ions through the $Si_{1-X}Ge_X$ layer to a depth of between about 3 nm to 100 nm below the $Si_{1-X}Ge_X$/Si interface; amorphizing the $Si_{1-X}Ge_X$ layer to form an amorphous, graded SiGe layer; and annealing the structure at a temperature of between about 650° C. to 1100° C. for between about ten seconds and sixty minutes to recrystallize the SiGe layer.

It is an object of the invention to provide a method to produce low defect density, 200 nm to 500 nm thick relaxed $Si_{1-x}Ge_x$ films with Ge content of up to 50% or more at the top surface for large-scale integrated circuit application.

Another object of the invention is to provide a method of commercial production of VLSI ICs having $Si_{1-x}Ge_x$ layers.

A further object of the invention is to provide a strained silicon layer on a relaxed $Si_{1-x}Ge_x$ layer.

Another object of the invention is to provide $Si/Si_{1-x}Ge_x$ structure which will speed up the switching speed of nMOS and pMOS transistors.

This summary and objectives of the invention are provided to enable quick comprehension of the nature of the invention. A more thorough understanding of the invention

DETAILED DESCRIPTION OF THE PREFERRED EMBODIMENT

As previously explained, SiGe is more easily damaged by ion implantation than is Si, making it difficult to produce a buried amorphous layer in SiGe. However, if the SiGe is covered with a thin silicon cap before ion implantation, the crystallinity of the silicon cap is more easily preserved and is able to form a template for solid phase epitaxy (SPE) of the underlying amorphized SiGe layer. The method of the invention involves amorphization/re-crystallization of a $Si_{1-x}Ge_x$ film having a thin silicon cap there over, in conjunction with hydrogen ion implantation to minimize defect density in the $Si_{1-x}Ge_x$ epilayer.

However, SPE of amorphized strained SiGe with more than 10% Ge has been observed to result in a heavily defected film, containing microtwins and stacking faults, which have been explained as being a stress relief mechanism, D. C. Paine, et al., *The growth of strained $Si_{1-x}Ge_x$ alloys on (001) silicon using solid phase epitaxy*, J. Mater. Res., vol. 5, 1023 (1990); and C. Lee, et al., *Kinetics of solid phase epitaxial regrowth in amorphized $Si_{0.88}Ge_{0.12}$ measured by time-resolved reflectivity*, Appl. Phys. Lett., vol. 62, 501 (1993). Correspondingly, it has been reported that SPE of relaxed SiGe amorphized by Si+ ion implantation results in a much better crystal than SPE of strained SiGe, Q. Z. Hong, et al., *Solid phase epitaxy of stressed and stress-relaxed Ge-Si alloys*, J. Appl. Phys. Vol. 71, 1768 (1992). Furthermore, the SPE recrystallization rate of strained SiGe is slower than that of silicon while the rate for relaxed SiGe is higher, id. This is attributed to changes in the activation barrier for SPE, id.

In this invention, variations of the fabrication method are disclosed in which the strained SiGe layer with silicon cap is first relaxed, e.g., by implanting hydrogen, either H+ or $H_2+$, as described in related Application 4, and annealing. Then, the buried amorphous SiGe region is produced by implanting Si+ or Ge+ and a low-defect, relaxed SiGe film is fabricated by SPE recrystallization using the top silicon cap as a seed.

Figure 1:
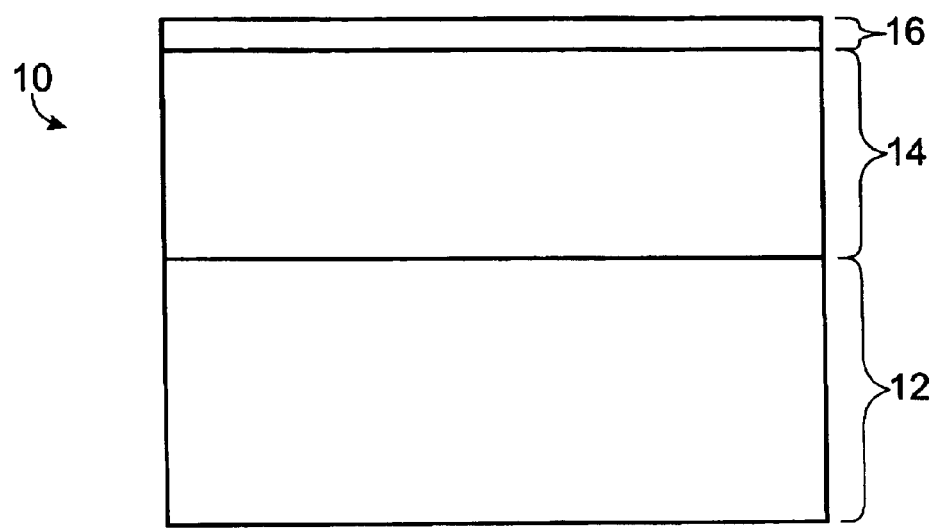
FIG. 1 depicts an as-grown film.

FIG. 1 illustrates the as-grown $Si_{1-x}Ge_x$ pseudomorphic (strained) film and a relaxed silicon cap, generally at 10. A silicon substrate 12 is prepared according to state-of-the-art techniques. A graded $Si_{1-x}Ge_x$ epitaxial layer 14 is grown to a thickness such that there is no relaxation in the $Si_{1-x}Ge_x$ layer at the growth temperature. Such a film may be thermodynamically metastable but still free of dislocations. The value of x at the bottom of the $Si_{1-x}Ge_x$ layer, that is at the $Si_{1-x}Ge_x$/Si interface, may be lower than about 0.05, while at the top surface of the $Si_{1-x}Ge_x$ layer it is between about 0.2 to 0.5, or higher, as required. The Ge concentration may be increased linearly, stepwise, or in some other fashion with increasing $Si_{1-x}Ge_x$ thickness. This is suitable for a $Si_{1-x}Ge_x$ film thickness of between about 200 nm to 500 nm. Because the SiGe film is not relaxed the top surface, it is free from defects. Alternatively, a $Si_{1-x}Ge_x$ epitaxial layer with constant value of x may be grown, but for any given value of x at the top surface,, a thinner film is required to avoid the nucleation of dislocations and resulting relaxation.

A thin epitaxial silicon cap 16 is grown on top of the $Si_{1-x}Ge_x$ epitaxial layer. The thickness should be much less than that of the SiGe; e.g., on the order of between about 10 nm to 20 nm. This silicon cap is relaxed during deposition and has the same cubic structure and lattice constant as the silicon substrate. At a later stage in the method of the invention, this silicon cap will be tensily strained. The upper limit of the thickness of silicon cap layer 16 is dependent on the expected subsequent strain reduction and the temperatures to which the entire structure will be subjected.

Figure 2:
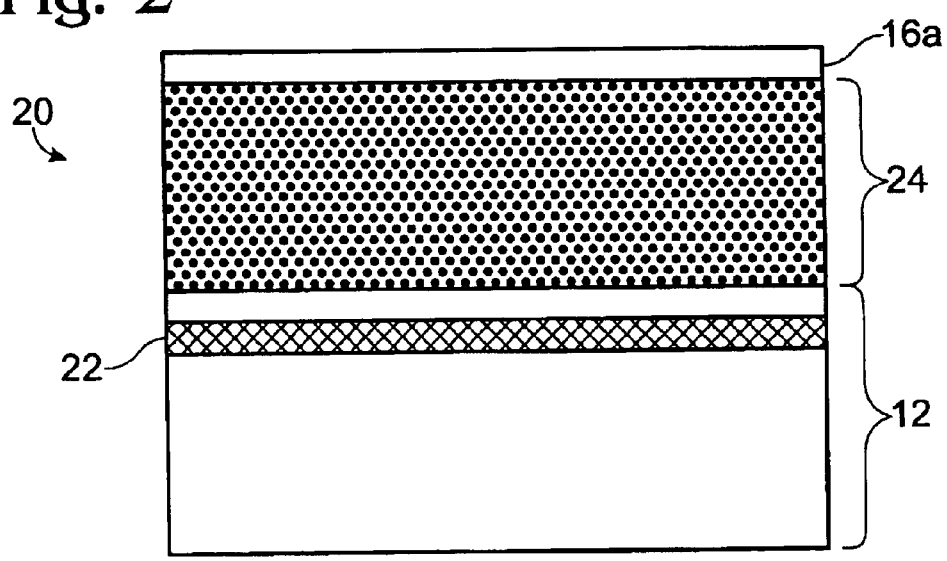
FIG. 2 depicts a cross-section of the film after hydrogen and Si+ or Ge− implantation, but before any annealing.

FIG. 2 illustrates the wafer 20 after implantation of Si+ or Ge+ ions, for the case in which there is no anneal after hydrogen implantation. Hydrogen ions (H+), on the order of between about $1 \times 10^{16}$ cm$^{-2}$ to $4 \times 10^{16}$ cm$^{-2}$ are implanted into the $Si_{1-x}Ge_x$ film at an appropriate ion energy, e.g., between about 30 keV to 80 keV, to form a layer 22 having a projected depth of between about 3 nm to 100 nm deeper than the $Si_{1-x}Ge_x$/Si interface. Alternatively, singly ionized molecular hydrogen, $H_2+$, having half the dose and twice the energy of H+, may be used, as described in related Application 4. Another alternative is to implant boron with the hydrogen, or to use helium ions. In this instance, hydrogen ions are implanted at a dose of between about $5 \times 10^{15}$ cm$^{-2}$ to $2 \times 10^{16}$ cm$^{-2}$ and an energy of between about 30 keV to 80 keV, and the boron ions are implanted at a dose of between about $5 \times 10^{12}$ cm$^{-2}$ to $5 \times 10^{16}$ cm$^{-2}$, and at an energy level sufficient to penetrate the surface to a depth similar to that of the hydrogen ions. Helium ions may be implanted at a dose of between about $1 \times 10^{16}$ cm$^{-2}$ to $4 \times 10^{16}$ cm$^{-2}$, again, at an energy level sufficient to penetrate the surface to a depth similar to that of the hydrogen ions.

At this point, the thin films may be annealed to relax the SiGe layer. The preferred annealing temperature is between about 700° C. to 1100° C. The preferred annealing time is between about 10 seconds to 60 minutes, or longer. Rapid thermal annealing or furnace annealing may be used. During the anneal, hydrogen ions implanted under the $Si_{1-x}Ge_x$/Si interface form hydrogen platelets and cavities which enhance nucleation of misfit dislocations and thus improve the efficiency of relaxation. Alternatively, annealing may be delayed until after implantation of the amorphizing species.

A high dose, e.g., $5 \times 10^{13}$ cm$^{-2}$ to $5 \times 10^{15}$ cm$^{-2}$ of heavy ions, such as silicon ions, at an energy of between about 30 keV to 500 keV, or germanium ions, at an energy of between about 60 keV to 1000 keV, are implanted into the $Si_{1-x}Ge_x$ epilayer to amorphize the $Si_{1-x}Ge_x$ epilayer, forming an amorphous, graded SiGe layer 24. Ideally the entire $Si_{1-x}Ge_x$ layer, except the top 10 nm to 50 nm, is converted to an amorphous structure. Therefore, multi-energy ion implantation is preferred for thicker $Si_{1-x}Ge_x$ films. However, even if the top of the $Si_{1-x}Ge_x$ layer is amorphized, silicon cap 16a is more resistant to implant damage and should remain crystalline, i.e. defect free.

Figure 3:
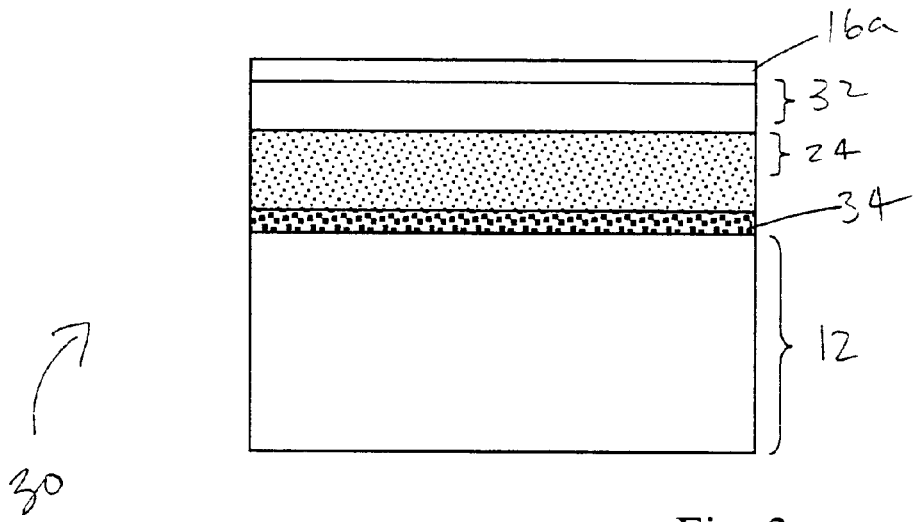
FIG. 3 is a "snap-shot" of a film cross-section during SPE recrystallization.

FIG. 3 illustrates the solid phase epitaxy re-growth during annealing, generally at 30. Next, the wafers undergo high temperature annealing resulting in solid phase re-crystallization. The annealing temperature is between about 650° C. to 1100° C., and the annealing time is between about 10 seconds to 60 minutes, or longer. Rapid thermal annealing or furnace annealing may be used. Recrystallization proceeds from both the top high quality silicon cap layer, resulting in a recrystallized SiGe layer 32, and from the $Si_{1-x}Ge_x$/Si interface. However, a region 34, which is recrystallized from the lower interface, is likely to be heavily defected because of strain. Therefore, the amorphizing species must be implanted sufficiently deep so that these defects are located below the space charge region during transistor operation. Moreover, the rate of recrystallization from the SiGe/Si interface may be slower, resulting in most of the SiGe film being recrystallized from the top silicon cap layer, which is desirable.

Figure 4:
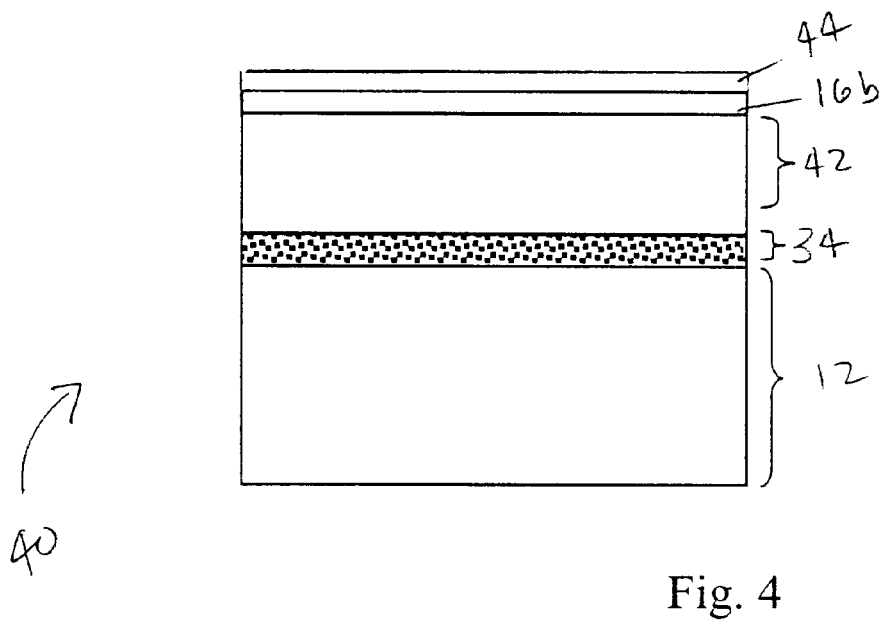
FIG. 4 depicts a cross-section of the film after SPE recrystallization.

FIG. 4 illustrates the wafer 40 with a nearly defect free, relaxed, re-crystallized $Si_{1-x}Ge_x$ layer having a tensile-strained thin silicon cap. When the SiGe film 42 re-crystallizes, it is relaxed. This forces the much thinner silicon cap, 16b, to be under tensile strain, which is the desired outcome for production of high mobility MOS transistors. However, during the annealing steps substantial amounts of Ge may diffuse into the silicon cap. If necessary, a thin, tensile-strained pure silicon cap 44 may be epitaxially grown on top of the initial thin silicon cap, to a thickness of between about 10 nm to 200 nm. This layer is sufficiently thin that it will not generate dislocations during deposition nor during any subsequent high temperature processing steps. The $Si/Si_{1-x}Ge_x$ structure formed by the method of the invention is operable to speed up the switching speed of nMOS and pMOS transistors.

Thus, an improved method for amorphization re-crystallization of $Si_{1-x}Ge_X$ films on silicon substrates has been disclosed. It will be appreciated that further variations and modifications thereof may be made within the scope of the invention as defined in the appended claims.

We claim:

1. A method of fabricating a $Si_{1-x}Ge_X$ film on a silicon substrate as part of an integrated circuit structure, comprising:
    preparing a silicon substrate;
    epitaxially depositing a graded $Si_{1-x}Ge_X$ layer on the silicon substrate forming a $Si_{1-x}Ge_X$/Si interface there between, wherein x is between about less than 0.05 at the $Si_{1-x}Ge_X$/Si interface and is between about 0.2 to greater than or equal to 0.05 at the top of the $Si_{1-x}Ge_X$ layer,
    epitaxially growing a silicon cap on the $Si_{1-x}Ge_X$ layer;
    implanting hydrogen ions through the $Si_{1-x}Ge_X$ layer to a depth of between about 3 nm to 100 nm below the $Si_{1-x}Ge_X$/Si interface;
    amorphizing the $Si_{1-x}Ge_X$ layer to form an amorphous, graded SiGe layer, including implanting ions taken from the group of ions consisting of silicon ions implanted at a dose of between about $5 \cdot 10^{13}$ cm$^{-2}$ to $5 \cdot 10^{15}$ cm$^{-2}$ at an energy of between about 30 keV to 500 keV and germanium implanted at a dose of between about $5 \cdot 10^{13}$ cm$^{-2}$ to $5 \cdot 10^{15}$ cm$^{-2}$ at an energy of between about 60 keV to 1000 keV; and
    annealing the structure at a temperature of between about 650° C. to 1100° C. for between about ten seconds and sixty minutes to recrystallize the SiGe layer.

2. The method of claim 1 which includes, after said implanting, annealing the structure for between about ten seconds and sixty minutes at a temperature of between about 700° C. to 1100° C. to relax the $Si_{1-x}Ge_X$ layer.

3. The method of claim 1 which further includes depositing the $Si_{1-x}Ge_X$ layer to a thickness of between about 200 nm to 500 nm.

4. The method of claim 1 wherein said epitaxially growing a silicon cap on the $Si_{1-x}Ge_X$ layer includes growing a silicon cap to a thickness of between about 10 nm to 20 mn.

5. The method of claim 1 wherein said implanting hydrogen ions includes implanting H+ ions at a dose of between about $1 \cdot 10^{16}$ cm$^{-2}$ to $4 \cdot 10^{16}$ cm$^{-2}$ at an energy level of between about 30 keV to 80 keV.

6. The method of claim 1 wherein said implanting hydrogen ions includes implanting boron ions with the H+ ions.

7. The method of claim 1 wherein said implanting hydrogen ions includes implanting $H_2$+ ions at a dose of between about $0.5 \cdot 10^{16}$ cm$^{-2}$ to $2 \cdot 10^{16}$ cm$^{-2}$ at an energy level of between about 60 keV to 160 keV.

8. The method of claim 1 wherein said implanting hydrogen ions includes implanting boron ions with the $H_2$+ ions.

9. The method of claim 1 which further includes growing a second silicon cap over the structure following the final annealing.

10. A method of fabricating a $Si_{1-x}Ge_X$ film on a silicon substrate as part of an integrated circuit structure, comprising:
    preparing a silicon substrate;
    epitaxially depositing a graded $Si_{1-x}Ge_X$ layer on the silicon substrate, wherein x is between about less than 0.05 at the $Si_{1-x}Ge_X$/Si interface and is between about 0.2 to greater than or equal to 0.5 at the top of the $Si_{1-x}Ge_X$ layer, and which further includes depositing the $Si_{1-x}Ge_X$ layer to a thickness of between about 200 nm to 500 nm forming a $Si_{1-x}Ge_X$/Si interface, there between;
    epitaxially growing a silicon cap on the $Si_{1-x}Ge_X$ layer to a thickness of between about 10 nm to 20 nm;
    implanting hydrogen ions through the $Si_{1-x}Ge_X$ layer to a depth of between about 3 am to 100 nmn below the $Si_{1-x}Ge_X$/Si interface, including implanting hydrogen ions taken from the group of hydrogen ions consisting of H+ ions implanted at a dose of between about $1 \cdot 10^{16}$ cm$^{-2}$ to $4 \cdot 10^{16}$ cm$^{-2}$ at an energy level of between about 30 keV to 80 keV and $H_2$+ ions implanted at a dose of between about $0.5 \cdot 10^{16}$ cm$^{-2}$ to $2 \cdot 10^{16}$ cm$^{-2}$ at an energy level of between about 60 keV to 160 keV;
    annealing the structure for between about ten seconds and sixty minutes at a temperature of between about 700° C. to 1100° C.
    amorphizing the $Si_{1-x}Ge_X$ layer to form an amorphous, graded SiGe layer, by implanting ions taken from the group of ions consisting of silicon ions implanted at a dose of between about $5 \cdot 10^{13}$ cm$^{-2}$ to $5 \cdot 10^{15}$ cm$^{-2}$ at an energy of between about 30 keV to 500 keV and germanium implanted at a dose of between about $5 \cdot 10^{13}$ cm$^{-2}$ to $5 \cdot 10^{15}$ cm$^{-2}$ at an energy of between about 60 keV to 1000 keV; and
    annealing the structure at a temperature of between about 650° C. to 1100° C. for between about ten seconds and sixty minutes to recrystallize the SiGe layer.

11. The method of claim 10 wherein said implanting hydrogen ions includes implanting boron ions with the hydrogen ions.

12. The method of claim 10 which further includes growing a second silicon cap over the structure following the final annealing.

13. A method of fabricating a $Si_{1-x}Ge_X$ film on a silicon substrate as part of an integrated circuit structure, comprising:
    preparing a silicon substrate;
    epitaxially depositing a graded $Si_{1-x}Ge_X$ layer on the silicon substrate forming a $Si_{1-x}Ge_X$/Si interface there between, wherein the $Si_{1-x}Ge_X$ is deposited to a thickness such that there is no relaxation at the growth temperature, and wherein x is between about less than 0.05 at the $Si_{1-x}Ge_x$/Si interface and is between about 0.2 to greater than or equal to 0.5 at the top of the $Si_{1-x}Ge_x$/Si interface and is between about 0.02 to greater than or equal to 0.05 at the top of the $Si_{1-x}Ge_x$ layer;

epitaxially growing a silicon cap on the $Si_{1-x}Ge_x$ layer to a thickness of between about 10 nm to 20 nm;

implanting hydrogen ions through the $Si_{1-x}Ge_x$ layer to a depth of between about 3 nm to 100 nm below the $Si_{1-x}Ge_x$/Si interface;

amorphizing the $Si_{1-x}Ge_x$ layer to form an amorphous, graded SiGe layer, by implanting ions taken from the group of ions consisting of silicon ions implanted at a dose of between about $5·10^{13}$ cm$^{-2}$ to $5·10^{15}$ cm$^{-2}$ at an energy of between about 30 keV to 500 keV and germanium implanted at a dose of between about $5·10^{13}$ cm$^{-2}$ to $5·10^{15}$ cm$^{-2}$ at an energy of between about 60 keV to 1000 keV; and annealing the structure at a temperature of between about 650° C. to 1100° C. for between about ten seconds and sixty minutes to recrystallize the SiGe layer.

14. The method of claim 13 which includes, after said implanting, annealing the structure for between about ten seconds and sixty minutes at a temperature of between about 700° C. to 1100° C.

15. The method of claim 13 which further includes depositing the $Si_{1-x}Ge_x$ layer to a thickness of between about 200 nm to 500 nm.

16. The method of claim 13 wherein said implanting hydrogen ions includes implanting ions taken from the group of ions consisting of H+ ions implanted at a dose of between about $1·10^{16}$ cm$^{-2}$ to $4·10^{16}$ cm$^{-2}$ at an energy level of between about 30 keV to 80 keV and $H_2$+ ions implanted at a dose of between about $0.5·10^{16}$ cm$^{-2}$ to $2·10^{16}$ cm$^{-2}$ at an energy level of between about 60 keV to 160 keV.

17. The method of claim 16 wherein said implanting hydrogen ions includes implanting boron ions with the hydrogen ions.

18. The method of claim 13 which further includes growing a second silicon cap over the structure following the final annealing.

* * * * *